United States Patent [19]

Lee

[11] Patent Number: 5,336,327
[45] Date of Patent: Aug. 9, 1994

[54] CVD REACTOR WITH UNIFORM LAYER DEPOSITING ABILITY

[75] Inventor: Hsing-Chung Lee, Woodland Hills, Calif.

[73] Assignee: Motorola, Inc., Schaumburg, Ill.

[21] Appl. No.: 154,575

[22] Filed: Nov. 19, 1993

Related U.S. Application Data

[62] Division of Ser. No. 891,013, Jun. 1, 1992.

[51] Int. Cl.⁵ .................................. C23C 16/00
[52] U.S. Cl. ............................ 118/730; 118/715; 118/725
[58] Field of Search ................... 118/715, 725, 730

[56] References Cited

U.S. PATENT DOCUMENTS

| | | | |
|---|---|---|---|
| 5,077,875 | 1/1992 | Hoke | 118/715 |
| 5,221,556 | 6/1993 | Hawkins | 118/730 |
| 5,261,960 | 11/1993 | Ozias | 118/730 |

Primary Examiner—Richard Bueker
Attorney, Agent, or Firm—Eugene A. Parsons

[57] ABSTRACT

A CVD reactor with a flat generally rectangularly shaped susceptor having a leading edge including a curve which is concave in the direction of gas flow through the reactor. The reactor produces epitaxial layers on semiconductor wafers in which the uniformity of the layer is dependent upon the radius of the concave curvature.

9 Claims, 2 Drawing Sheets

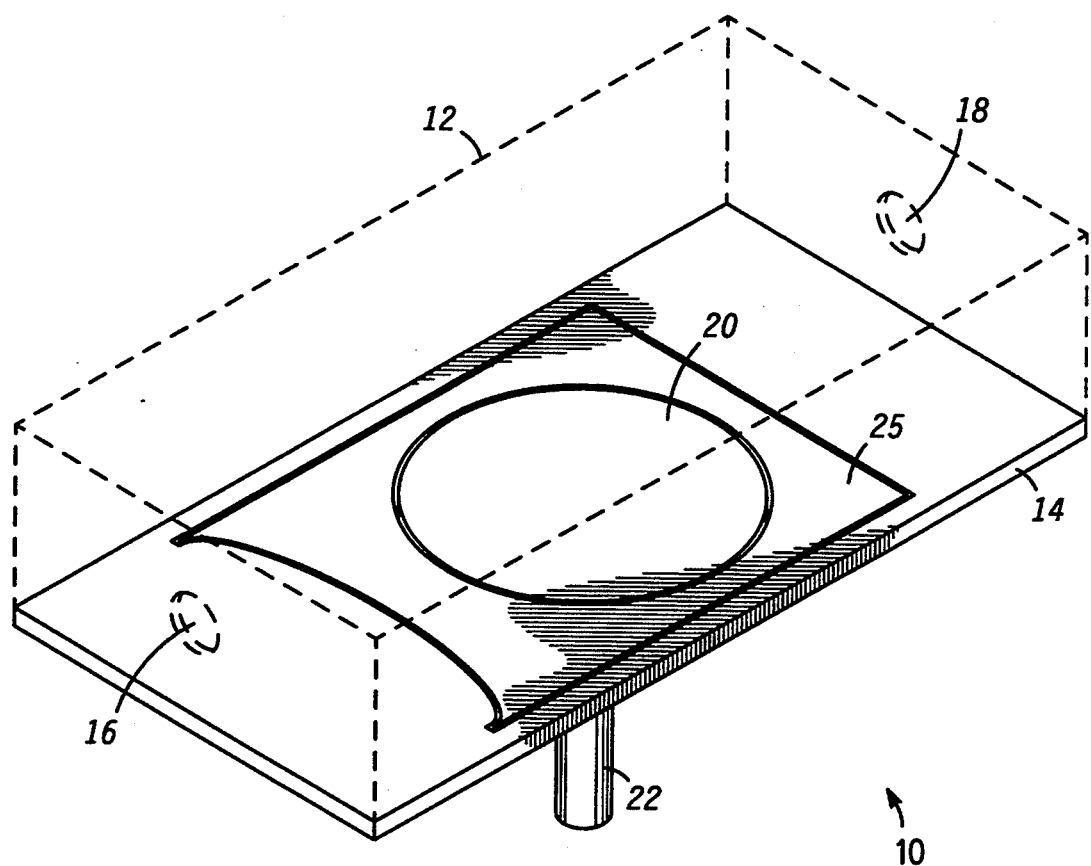
FIG. 1
FIG. 2
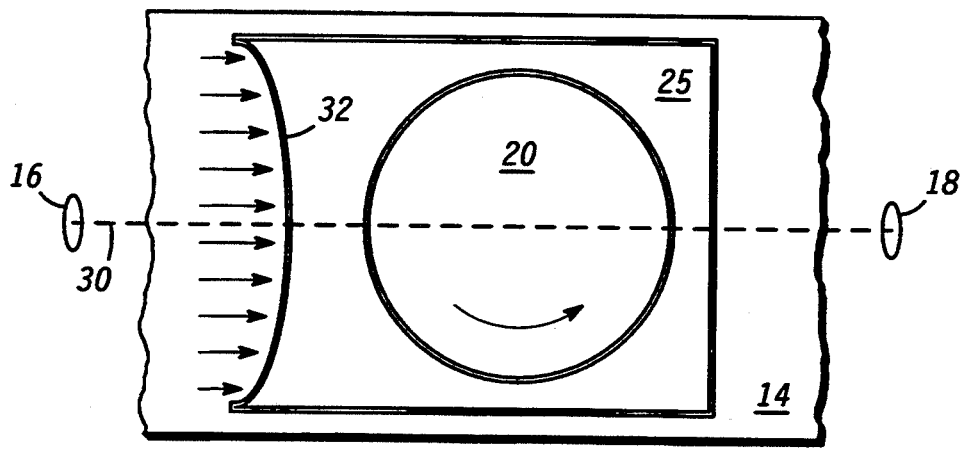

CVD REACTOR WITH UNIFORM LAYER DEPOSITING ABILITY

This is a division of application Ser. No. 07/891,013, filed Jun. 1, 1992.

The present invention pertains to chemical vapor deposition (CVD) reactors and more specifically to a CVD reactor for providing improved layer uniformity.

BACKGROUND OF THE INVENTION

CVD reactors are utilized for vapor depositing coatings on some type of flat surface. Reactors of this type are especially useful in the semiconductor industry for vapor depositing coatings on semiconductor wafers. In one very specific application metal organic chemical vapor deposition (MOCVD) reactors are utilized to deposit compound semiconductor epitaxial layers on semiconductor wafers, such as GaAs. When depositing GaAs epitaxial layers it is extremely important that the layers have a uniform thickness. Further, it is much easier to achieve acceptable uniformity in smaller semiconductor wafers having a diameter of 2–3 inches, whereas uniformity becomes a very real problem when the size of the wafers is increased to a diameter in the range of 4–8 inches.

In a horizontal CVD reactor, the reactant is depleted in the flow direction as it flows over a susceptor and the wafer to be coated. The growth rate is:

$$g(r) = g_o * exp - A * [K_g * r / (h * v)]$$

where:

h is the stagnant layer thickness,
Kg is a reaction coefficient,
A is an experimentally determined constant and
v is the gas velocity.

One way to improve uniformity of deposited layers is to increase the gas velocity by using high gas flow and/or low reactor pressure. Usually this is at the expense of low material utilization efficiency. Another way which has been commonly used in the past to improve the uniformity, however in somewhat of an arbitrary fashion, is to rotate the substrate as the material is being deposited. The ideal is to average out the gas depletion effect by rotating the substrate. For a substrate of small to moderate size, i.e. 1–3 inches, this method seems to be satisfactory to a certain extent, e.g. for a typical uniformity of no less than ±5%. However, for larger wafers, i.e. 4–8 inches and above, an averaging scheme by rotating the substrate alone is not sufficient to achieve stringent uniformity requirements, e.g. ±1% or less, since the growth rate curve is integrated with time in a nonlinear fashion (cosine-like). The thickness at the center of the wafer after one rotation is a product of a constant growth rate at that position and one cycle time. On the other hand, the thickness at the edge of the wafer after one rotation is proportional to the integration of the growth rate profile with time.

SUMMARY OF THE INVENTION

It is a purpose of the present invention to provide a new and improved CVD reactor.

It is a further purpose of the present invention to provide a new and improved reactor capable of depositing layers of material with a uniformity below approximately 1.0%.

The above problems and others are substantially solved and the purposes met by a CVD reactor including a housing defining a cavity having a generally flat surface with a wafer receiving rotatable platform mounted therein, the housing further including a gas inlet to one side of the platform and a gas outlet to an opposite side of the platform for causing gas introduced into the cavity through the gas inlet to flow across a portion of the flat surface and the platform, a substantially flat susceptor positioned on the flat surface of the cavity and substantially surrounding the rotatable platform so that gas flowing across the portion of the flat surface and platform flows across the susceptor, the susceptor having a leading edge extending from one side of a line through the gas inlet, the rotatable platform and the gas outlet to a side of the line opposite the one side, and the leading edge of the susceptor having a generally concave curvature relative to the gas inlet.

BRIEF DESCRIPTION OF THE DRAWINGS

Referring to the drawings:

FIG. 1 is a view in perspective of a rectangular, horizontal CVD reactor embodying the present invention;

FIG. 2 is an enlarged view in top plan of the curved susceptor from FIG. 1;

DESCRIPTION OF THE PREFERRED EMBODIMENTS

Figure 3:
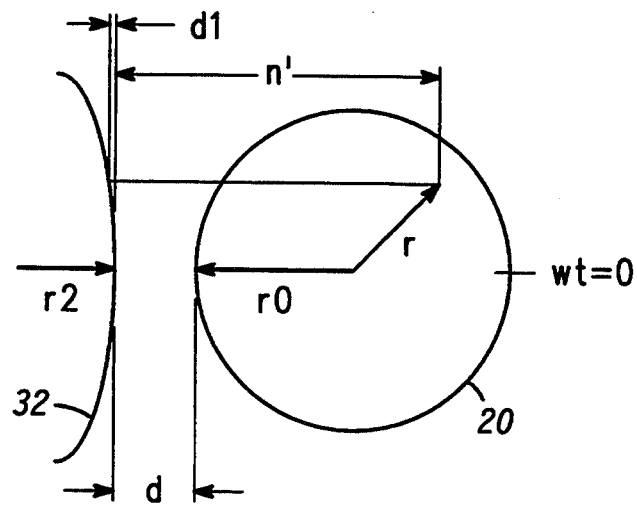
FIG. 3 is a diagrammatic view of various relationships between points in FIG. 2.

Referring specifically to FIG. 1, a rectangular, horizontal CVD reactor 10 is illustrated in a simplified perspective view. Reactor 10 includes a housing 12 defining a cavity therein with a generally flat lower surface 14. Housing 12 further has a gas inlet 16 at one end thereof and a gas outlet 18 at an opposite end thereof. Reactant gases are introduced to the cavity by way of inlet 16, flow the length of the cavity and are evacuated by outlet 18. A wafer receiving, rotatably mounted platform 20 is positioned in flat side 14 so that reactant gases flowing from inlet 16 to outlet 18 flow across a portion of surface 14 and across platform 20 to react with objects placed on platform 20. Platform 20 is rotated by some convenient means, such as a variable motor (not shown) connected to an externally extending shaft 22. While inlet 16 and outlet 18 are illustrated as simple holes, for convenience of this description, it should be understood by those skilled in the art that inlet 16 and outlet 18 are formed to provide a constant and uniform flow of reactant gases across susceptor 25 and platform 20.

A generally rectangularly shaped susceptor 25 is positioned on surface 14 substantially surrounding platform 20. As is known in the art, susceptor 25 is positioned so that the reactant gases flow over the surface thereof prior to and during passage across platform 20. Susceptor 25 is heated to cause the reactant gases flowing thereover to be heated and to, therefore, react with objects of the proper constitution positioned on platform 20. Susceptor 25 is formed of some convenient material, such as graphite, which can be heated to the necessary temperature without damaging the structure or unduly effecting the reaction of the gas and the desired object.

As a typical example, reactor 10 is utilized to deposit an epitaxial layer on a GaAs wafer for use in the semiconductor field. In this particular example the uniformity of the deposited layer is extremely important. A GaAs semiconductor wafer with a diameter larger than 4 inches is placed on platform 20. It should of course be understood by those skilled in the art that working with larger wafers is more efficient and, therefore, the larger the wafer which can conveniently and accurately have a uniform epitaxial layer formed thereon the more efficient the entire manufacturing process becomes. It should also be understood that preferably each reactor constructed will have a cavity, susceptor and wafer receiving platform constructed specifically for one size of wafer, although other sizes of wafers could be operated upon with a reduced efficiency.

With the semiconductor wafer properly positioned on platform 20, the platform is continuously rotated by means of shaft 22. Susceptor 25 is heated to the required temperature, generally in the range of 600 to 1250 degrees Centigrade; and reactant gases are introduced into the cavity by means of gas inlet 16. Typical reactant gasses utilized for deposition of epitaxial silicon layers include one of: silicon tetrachloride ($SiCl_4$), trichlorosilane ($SiHCl_3$), dichlorosilane ($SiH_2Cl_2$), and silane ($SiH_4$). In some instances hydrogen gas may be included also. As the gasses flow over the heated wafer a complicated reaction occurs which results in solid silicon being deposited on the wafer and reaction gasses exiting from the reactor.

Referring to FIG. 2, an enlarged view in top plan of susceptor 25 and platform 20 is illustrated. Susceptor 25 is generally rectangularly shaped, in this specific example, and platform 20 is positioned generally centrally in susceptor 25 so that reactant gases flowing across platform 20 are uniformly heated. For convenience of this description only and not to limit the structure in any way, a reference line 30 is illustrated as extending from inlet 16 to outlet 18. A leading edge 32 of susceptor 25 extends from one side of line 30 to the other side thereof and is positioned adjacent inlet 16 so that reactant gases flowing across susceptor 25 encounter leading edge 32 first. Leading edge 32 is formed with a curvature that is concave relative to inlet 16.

Referring to FIG. 3, a pictorial description of the relationship between various points on platform 20 and leading edge 32 is illustrated. Platform 20 has a radius $r_0$, which will generally be the diameter of wafers positioned thereon. Leading edge 32 of susceptor 25 has a radius of $r_2$ and the distance between the closest point on leading edge 32 of susceptor 25 and the closest point on platform 20 is d. Further, the farthest point on platform 20 from leading edge 32 is designated wt=0, where wt represents the rotation of platform 20. Also, the distance between any desired point on platform 20 and leading edge 32, n', is represented by the radius r and the additional distance $d_1$ between the distance d and the point at which a parallel line through r intercepts leading edge 32. The growth rate at any specific point is represented by:

$$g(n') \rightarrow g(t)$$

which, upon substitution, can be stated:

$$g(t) = e^{-A[d+r0+r\cos wt + d_1(t)]}$$

where:

-continued $$d_1 = r_2 - \sqrt{r_2^2 - (r\sin wt)^2} = d_1(t).$$

Figure 4:
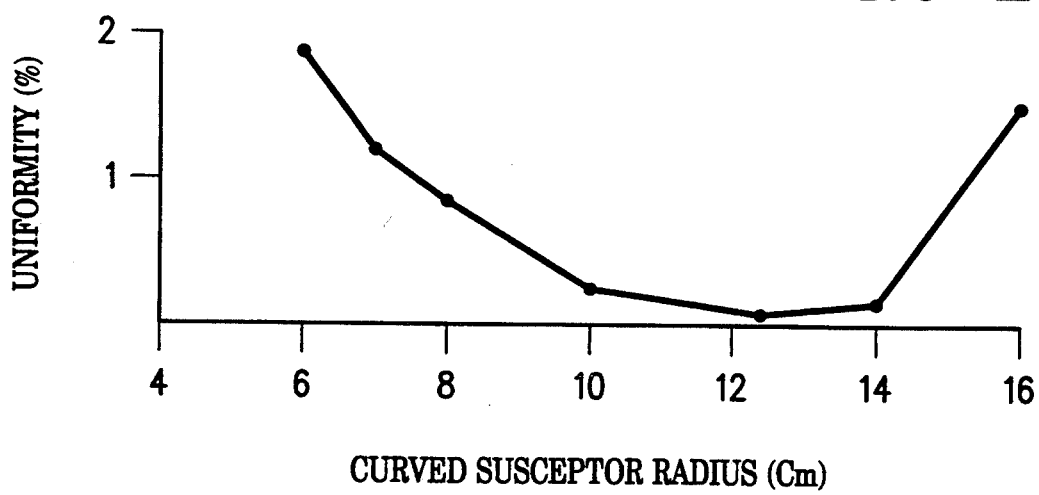
FIG. 4 is a graph of the uniformity of deposited layers versus the radius of curvature of the leading edge of the susceptor.

Thus, since the growth rate can be determined at each specific point on platform 20, and since that growth rate is a function of radius $r_2$ of leading edge 32 of susceptor 25, optimum uniformity for each size of wafer can be calculated by integrating g(t). As a result, layers can be deposited on wafers utilizing different curvatures for leading edge 32 and the uniformity of the layers can be measured to determine a curvature that provides a desired uniformity. Here it should be noted that the shape and curvature of the leading edge of the susceptor is dependent upon a lateral profile of the gas velocity upstream of the susceptor leading edge. It is difficult to measure the lateral profile of the upstream gas velocity and, therefore, an optimum shape and curvature is determined by the above integration or empirically. Referring to FIG. 4, a graph representing the radius, $r_2$, of leading edge 32 and the resulting uniformity of deposited layers is illustrated by assuming a growth rate profile across susceptor 25 and a uniform lateral velocity profile upstream of the susceptor leading edge. From this graph it can be seen that a uniformity of better than 1% is achieved when the leading edge 32 of susceptor 25 has a curvature with a radius of between approximately 8 and 15 cms.

A specific example is given above in which a rectangular horizontal CVD reactor is utilized to deposit epitaxial layers on GaAs semiconductor wafers. It will be understood, however, that other single wafer reactors, such as the flare-type for example, can be utilized. Also, different types of susceptors, wafers and reactant gases can be utilized, as will be clear to those skilled in the art.

Thus, an improved CVD reactor is disclosed and an improved method of depositing a substantially uniform layer on a wafer or other desired object. It is important to understand the ease and flexibility of implementing the curtailed susceptor leading edge. Further, the curtailed susceptor makes previously inadequate reactors, such as the rectangular horizontal reactor, a very viable approach to growing layers on large size wafers with good uniformity and growth efficiency.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

What is claimed is:

1. A CVD reactor comprising:
    a housing defining a cavity having a generally flat surface with a wafer receiving rotatable platform mounted therein, the housing further including a gas inlet to one side of the platform and a gas outlet to an opposite side of the platform for causing gas introduced into the cavity through the gas inlet to flow across a portion of the flat surface and the platform;
    a substantially flat susceptor positioned on the flat surface of the cavity and substantially surrounding the rotatable platform so that gas flowing across the portion of the flat surface and platform flows across the susceptor, the susceptor having a leading edge extending from one side of a line through the gas inlet, the rotatable platform and the gas outlet to a side of the line opposite the one side; and the leading edge of the susceptor having a generally concave curvature relative to the gas inlet.

2. A CVD reactor as claimed in claim 1 wherein the susceptor is formed substantially of graphite.

3. A CVD reactor as claimed in claim 1 wherein the platform is constructed to receive a semiconductor wafer positioned thereon.

4. A CVD reactor as claimed in claim 1 wherein the platform is constructed to receive a wafer up to 8 inches in diameter positioned thereon.

5. A CVD reactor as claimed in claim 3 wherein the reactor includes apparatus for growing epitaxial layers.

6. A CVD reactor as claimed in claim 1 wherein the leading edge of the susceptor with a concave curvature includes a curve having a radius in the range of 8-15 cm.

7. A CVD reactor as claimed in claim 1 wherein the leading edge of the susceptor includes a shape and curvature determined by a lateral gas velocity profile upstream of the susceptor leading edge.

8. A CVD reactor as claimed in claim 1 wherein the substantially flat susceptor includes a susceptor which is generally rectangularly shaped.

9. A CVD reactor as claimed in claim 1 wherein the reactor is the rectangular horizontal type.

* * * * *